United States Patent
Wu

(10) Patent No.: US 10,657,915 B2
(45) Date of Patent: May 19, 2020

(54) SCAN SIGNAL COMPENSATING METHOD AND DEVICE BASED ON GATE DRIVING CIRCUIT

(71) Applicant: Xianyang Caihong Optoelectronics Technology Co., Ltd, Xianyang (CN)

(72) Inventor: Yuan-Liang Wu, Xianyang (CN)

(73) Assignee: XIANYANG CAIHONG OPTOELECTRONICS TECHNOLOGY CO., LTD, Xianyang (CN)

( * ) Notice: Subject to any disclaimer, the term of this patent is extended or adjusted under 35 U.S.C. 154(b) by 0 days.

(21) Appl. No.: 16/221,957

(22) Filed: Dec. 17, 2018

(65) Prior Publication Data

US 2019/0197972 A1    Jun. 27, 2019

(30) Foreign Application Priority Data

Dec. 21, 2017    (CN) .......................... 2017 1 1392016

(51) Int. Cl.
| | |
|---|---|
| *G09G 3/36* | (2006.01) |
| *G02F 1/1362* | (2006.01) |
| *G02F 1/1345* | (2006.01) |
| *H01L 27/12* | (2006.01) |

(52) U.S. Cl.
CPC ......... *G09G 3/3655* (2013.01); *G02F 1/1362* (2013.01); *G02F 1/13452* (2013.01); *G02F 1/13454* (2013.01); *G09G 3/3677* (2013.01); *H01L 27/124* (2013.01); *H01L 27/1255* (2013.01); *G09G 2310/0289* (2013.01); *G09G 2320/0257* (2013.01)

(58) Field of Classification Search
None
See application file for complete search history.

(56) References Cited

U.S. PATENT DOCUMENTS

| 2007/0052646 A1* | 3/2007 | Ishiguchi | ............. | G09G 3/3648 345/92 |
| 2008/0170064 A1* | 7/2008 | Lee | ...................... | G09G 3/3677 345/214 |
| 2009/0102779 A1* | 4/2009 | Jo | ........................ | G09G 3/3696 345/101 |

(Continued)

FOREIGN PATENT DOCUMENTS

KR    20070109165 A    * 11/2007

*Primary Examiner* — Dorothy Harris
(74) *Attorney, Agent, or Firm* — WPAT, PC

(57) ABSTRACT

A scan signal compensating method and a scan signal compensating device based on a scan driving circuit are provided. The method exemplary includes: acquiring a scan signal compensation voltage value in a detecting period; adjusting a clock signal(s) and a DC voltage source(s) inputted to the gate driving circuit according to the scan signal compensation voltage value, in an adjusting period. In particular, after the scan signal compensation voltage value is obtained, amplitudes of the clock signal(s) and the DC voltage source(s) inputted into the gate driving circuit are adjusted, thereby solving problems of ghost and flicker of a display device caused by pixel capacitance leakage in the active area resulting from the drift of I-V characteristic curve of TFTs in the active area suffered from a long-term voltage difference.

12 Claims, 5 Drawing Sheets

(56) References Cited

U.S. PATENT DOCUMENTS

| | | | |
|---|---|---|---|
| 2010/0066724 A1* | 3/2010 | Huh | G09G 3/3677 345/213 |
| 2012/0062534 A1* | 3/2012 | Kao | G09G 3/20 345/208 |
| 2012/0098814 A1* | 4/2012 | Hou | G09G 3/3677 345/212 |
| 2013/0314392 A1* | 11/2013 | Kim | G09G 3/20 345/212 |
| 2013/0328846 A1* | 12/2013 | Jamal | G06F 1/3265 345/211 |
| 2014/0168186 A1* | 6/2014 | Kang | G09G 3/3648 345/212 |
| 2015/0170571 A1* | 6/2015 | Park | G09G 3/3266 345/690 |
| 2015/0279289 A1* | 10/2015 | Yu | G02F 1/13306 345/690 |
| 2016/0210930 A1* | 7/2016 | Lee | G09G 3/3685 |
| 2016/0343341 A1* | 11/2016 | Kwak | G09G 3/3677 |
| 2017/0011700 A1* | 1/2017 | Kim | G09G 3/3688 |
| 2017/0098409 A1* | 4/2017 | Heo | G09G 3/3266 |
| 2019/0114953 A1* | 4/2019 | Wu | G09G 3/20 |
| 2019/0147827 A1* | 5/2019 | Wu | G09G 3/3696 345/214 |
| 2019/0197977 A1* | 6/2019 | Wu | G09G 3/3677 |
| 2019/0197978 A1* | 6/2019 | Wu | G09G 3/3677 |
| 2019/0244580 A1* | 8/2019 | Kwon | G09G 3/3677 |

\* cited by examiner

SCAN SIGNAL COMPENSATING METHOD AND DEVICE BASED ON GATE DRIVING CIRCUIT

FIELD OF THE DISCLOSURE

The disclosure relates to the field of liquid crystal display technologies, and more particularly to a scan signal compensating method based on a gate driving circuit and a scan signal compensating device based on a gate driving circuit.

BACKGROUND

With the development of thin film transistor liquid crystal display (TFT-LCD) devices, the competition of liquid crystal products has become more and more fierce, and various manufacturers begin to develop new technologies to occupy the market. The technology of gate driver on array (GOA) integrates a gate driver on a glass substrate to achieve the function of panel scanning. Due to its low cost, low power consumption, narrow border and other advantages, it has gradually become a new research direction of manufacturers. In the development of GOA technology, most focus on the research of driving circuits to realize large-size and high-resolution applications.

Referring to FIG. 1 and FIG. 2, FIG. 1 is a schematic structural view of a TFT in an active area provided by a related art, and FIG. 2 is a schematic view of I-V characteristic curves of a certain selected TFT in the active area provided by a related art. For properties of an amorphous silicon TFT itself, as long as there is a voltage difference between the gate and the source/drain for a long time, the I-V characteristic of the TFT would change, that is, a drain current Id would drift under a same gate-source voltage $V_{GS}$. For pixels of a LCD panel, in a practical application of using the amorphous silicon TFT, the gate voltage is kept at a low level while the source and drain voltages are kept at high levels for a long time, which would cause charging abilities of the pixels to be changed and thereby affect display defect of the LCD panel consequently for example, resulting in problems such as image ghost and flicker.

SUMMARY

In order to solve the above problems described in related art, the disclosure provides a scan signal compensating method and a scan signal compensating device based on a gate driving circuit.

In the disclosure, a scan signal compensating method based on a gate driving circuit according to an embodiment is provided. The compensating method includes steps of: acquiring a scan signal compensation voltage value in a detecting period; and adjusting a clock signal(s) and a DC voltage source(s) inputted into the gate driving circuit according to the scan signal compensation voltage value, in an adjusting period.

In an embodiment, the step of acquiring a scan signal compensation voltage value includes: obtaining an accumulated working time of a display device with the gate driving circuit; and finding the scan signal compensation voltage value from a first look-up table according to the accumulated working time.

In an alternative embodiment, the step of acquiring a scan signal compensation voltage value includes: disposing a reference TFT; obtaining a driving current of the reference TFT; acquiring a driving current drift value according to the driving current; and finding the scan signal compensation voltage value from a second look-up table according to the driving current drift value.

In an embodiment, the gate driving circuit includes a GOA driving circuit; and correspondingly the GOA driving circuit includes a pull-up control unit, a pull-up unit, a pull-down unit and a pull-down maintaining unit (44). The pull-up control unit is configured (i.e., structured and arranged) to control the startup of the GOA driving circuit; the pull-up unit is configured to control the GOA driving circuit to output a turn-on voltage; the pull-down unit is configured to control the GOA driving circuit to output a turn-off voltage; and the pull-down maintaining unit is configured to maintain the GOA driving circuit to output the turn-off voltage.

In an embodiment, the step of adjusting a clock signal(s) and a DC voltage source(s) inputted into the gate driving circuit includes: adjusting a high voltage level of the clock signals inputted to the gate driving circuit according to the scan signal compensation voltage value; and adjusting a first DC voltage value and a second DC voltage value inputted into the gate driving circuit according to the scan signal compensation voltage value.

In an embodiment, a first adjustment value corresponding to the high voltage level of the clock signal(s) is equal to a second adjustment value corresponding to the second DC voltage value.

In an embodiment, the step of adjusting a high voltage level of the clock signal(s) inputted into the gate driving circuit includes: controlling a power management integrated circuit to adjust amplitude of the high voltage level of the clock signal(s) outputted to a level shift circuit, in a period of next power on or an image being switched.

In an embodiment, the step of adjusting a first DC voltage value and a second DC voltage value includes: controlling a power management integrated circuit to adjust magnitudes of the first DC voltage value and the second DC voltage value outputted to the gate driving circuit, in a period of next power on or an image being switched. Moreover, the amplitude of the first DC voltage value is greater than that of the second DC voltage value.

In an embodiment, a scan signal compensating device based on a scan driving circuit is provided. The device includes: an acquisition module, configured to acquire a scan signal compensation voltage value during the detecting period; and an adjustment module, configured to adjust a clock signal(s) and a DC voltage source(s) inputted into the gate driving circuit according to the scan signal compensation voltage value, during an adjusting period.

In an embodiment, the adjustment module includes: a first adjustment unit, configured to adjust a high voltage level of the clock signal(s) (CK&XCK) inputted to the gate driving circuit according to the scan signal compensation voltage value; and a second adjustment unit, configured to adjust a first DC voltage value and a second DC voltage value inputted into the gate driving circuit according to the scan signal compensation voltage value.

In the embodiments of the disclosure, after the scan signal compensation voltage value is obtained, amplitudes of the clock signal(s) and the DC voltage source(s) inputted into the gate driving circuit are adjusted, thereby solving problems of ghost and flicker of the display device caused by pixel capacitance leakage in the active area resulting from the drift of I-V characteristic curve of TFTs in the active area suffered from a long-term voltage difference.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the drawings.

DETAILED DESCRIPTION OF PREFERRED EMBODIMENTS

Figure 1:
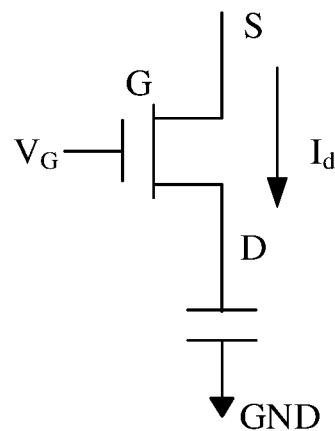
FIG. 1 is a schematic structural view of a TFT in an active area in related art.
Figure 2:
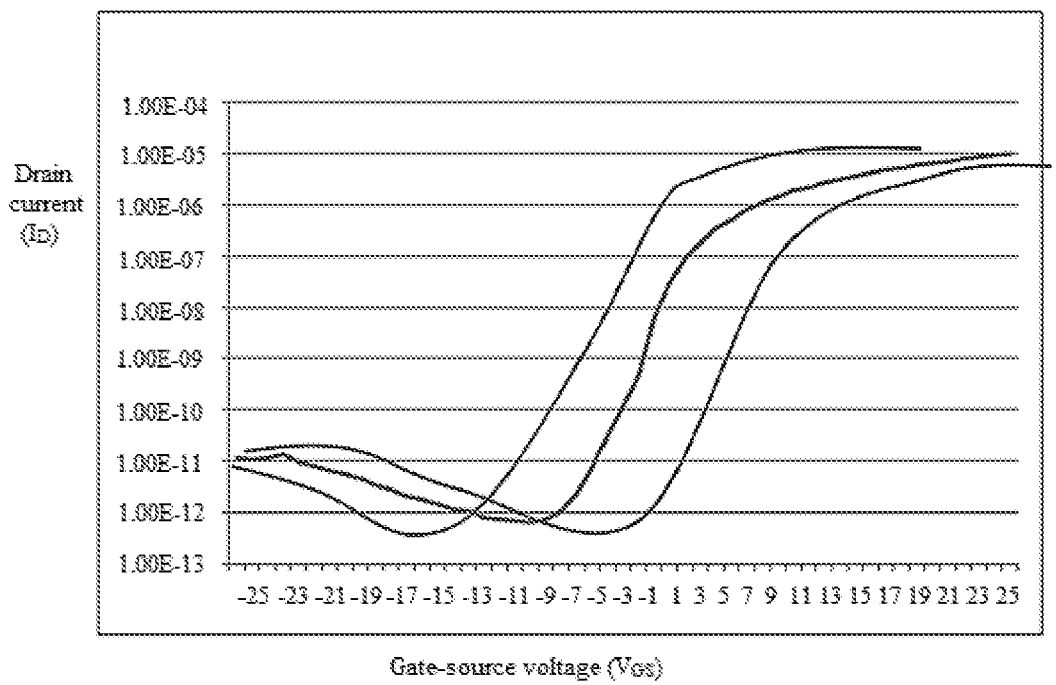
FIG. 2 is a schematic view showing I-V characteristic curves of a certain selected TFT in the active area in related art.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Embodiment 1

Figure 3:
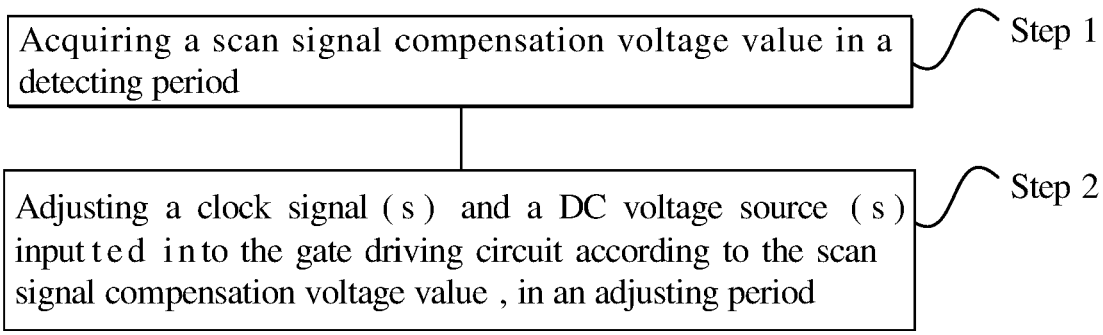
FIG. 3 is a schematic flowchart of a scan signal compensating method based on a gate driving circuit, according to an embodiment of the disclosure.

Please refer to FIG. 3, and FIG. 3 is a schematic flowchart of a scan signal compensating method based on a gate driving circuit, according to an embodiment of the disclosure. The compensating method is suitable for a TFT-LCD device, and its working principle is also suitable for other display devices such as a LED display device, an OLED display device or the like. The compensating method can effectively solve a problem of insufficient pixel charging caused by a drift of I-V characteristic resulting from a TFT(s) in an active area suffered from a long-term bias voltage during working. Specifically, the scan signal compensating method may include the following steps i.e., Step 1 and Step 2.

Step 1, acquiring a scan signal compensation voltage value in a detecting period.

Step 2, adjusting a clock signal(s) and a DC voltage source(s) inputted into a gate driving circuit according to the scan signal compensation voltage value, in an adjusting period.

For the Step 1 of obtaining a scan signal compensation voltage value can be implemented by following two ways, i.e., a first way and a second way.

The first way is time detecting, and in this way, the Step 1 includes:

Sub-step 11a, obtaining an accumulated working time of a display device;

Sub-step 12a, finding the scan signal compensation voltage value from a first look-up table according to the accumulated working time.

Specifically, gate voltages and source voltages of a TFT(s) in the active area of the display device in a time period are counted, and a pre-stored mapping table (i.e., the first look-up table) is searched according to a time length of the time period and statistical values of voltages of gate, source and drain to determine the scan signal compensation voltage value. A voltage of the scan signal then is adjusted according to the scan signal compensation voltage value, so that a drift(s) of drain current of the TFT(s) in the active area can be eliminated consequently. For the specific implementation, please refer to the Chinese patent document CN 201710949232.5 (which is a Chinese patent application serial number and has a same assignee as that of the instant application), the disclosure of which is incorporated herein by reference.

The second way is current detecting, and in this way, the Step 1 includes:

Sub-step 11b, disposing a reference TFT;

Sub-step 12b, obtaining a driving current of the reference TFT;

Sub-step 13b, acquiring a driving current drift value according to the driving current;

Sub-step 14b, finding the scan signal compensation voltage value from a second look-up table according to the driving current drift value.

In particular, the reference TFT is disposed at a position (for example, a dummy area) outside the active area to simulate a working condition(s) of the TFT(s) in the active area, the reference TFT then is detected/sensed to obtain the driving current associated with the TFT(s) in the active area, and afterwards the driving current drift value is obtained according to the driving current. After that, the scan signal compensation voltage value is determined from a pre-stored compensation look-up table (i.e., the second look-up table) according to the driving current drift value, and the scan signal compensation voltage value is used to adjust a voltage of the scan signal, so that the problem of image ghost in the display device caused by the drift of I-V characteristic of the TFT(s) suffered from a long-term bias voltage can be overcome consequently.

Figure 4:
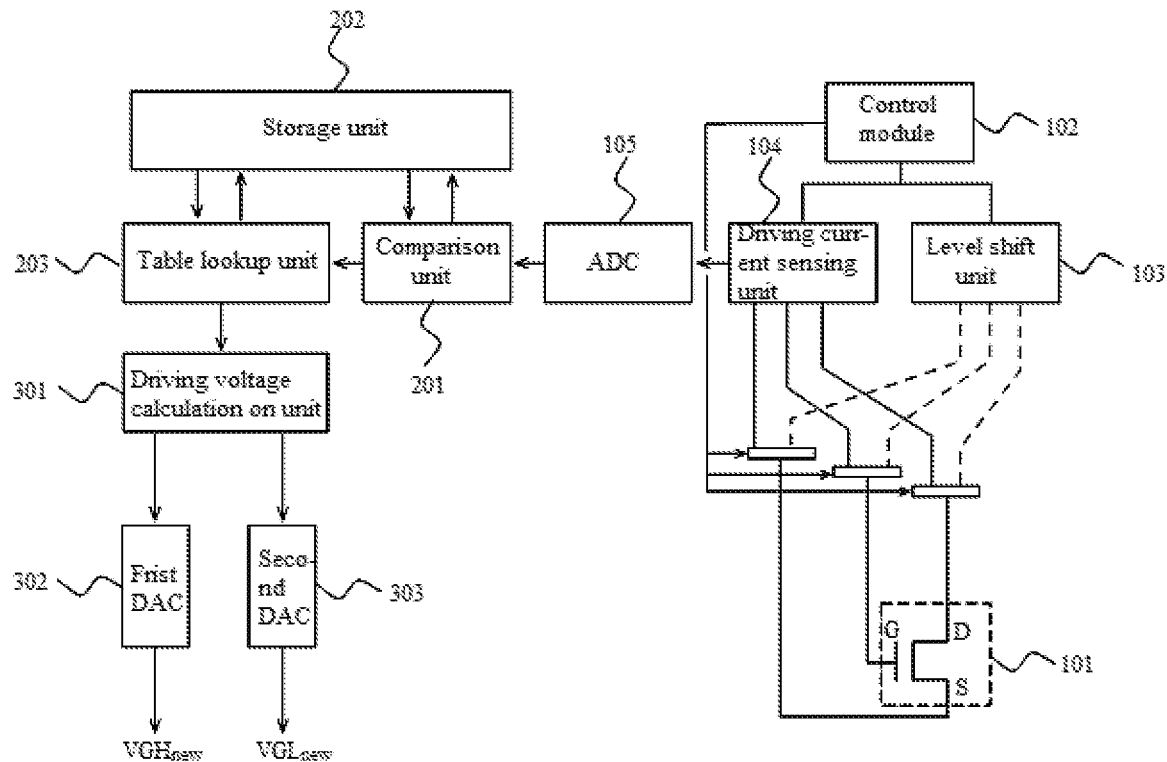
FIG. 4 is a schematic block diagram of a scan signal compensation circuit according to an embodiment of the disclosure.
Figure 5:
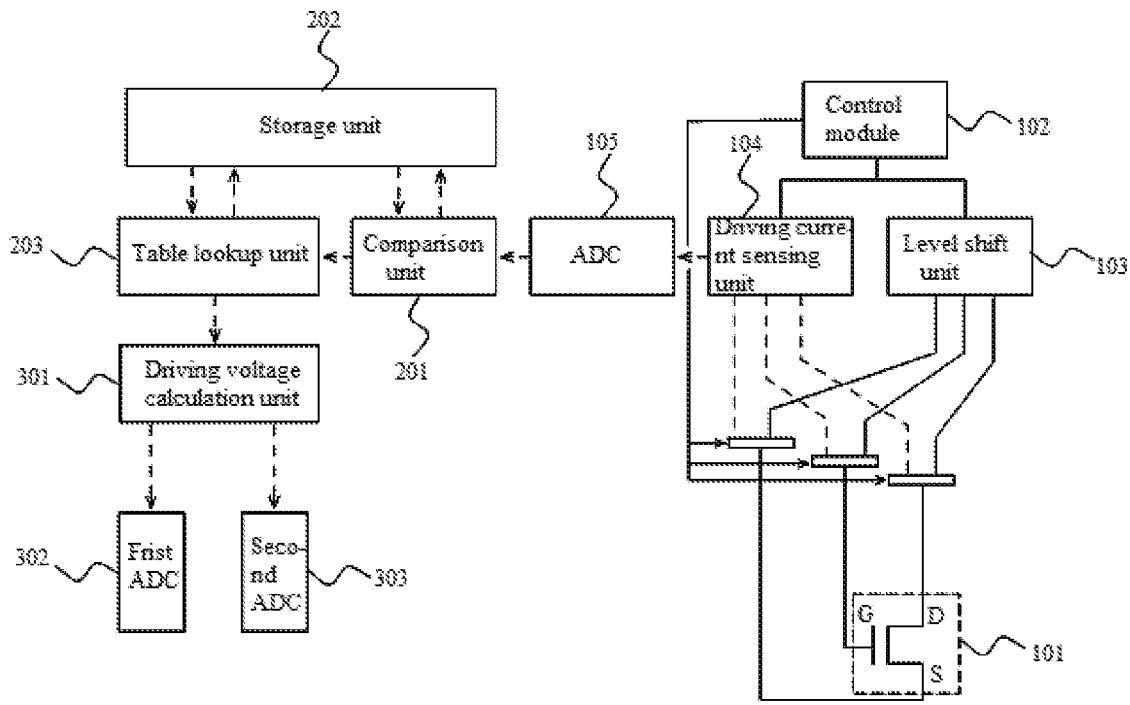
FIG. 5 is another schematic block diagram of the scan signal compensation circuit according to an embodiment of the disclosure.

More specifically, please refer to FIG. 4 and FIG. 5, FIG. 4 is a schematic block diagram of a scan signal compensation circuit according to an embodiment of the disclosure, and FIG. 5 is another schematic block diagram of the scan signal compensation circuit according to the embodiment of the disclosure. FIG. 4 corresponds to a display mode, and FIG. 5 corresponds to a detection compensation mode.

A working principle of obtaining the scan signal compensation voltage value is described in detail as follows.

In the display mode, a control module (also referred to as controller, such as MCU, DSP, or the like) 102 controls the level shift unit (also referred to as level shifter) 103 to output voltages of a source S, a drain D and a gate G of the reference TFT 101 and makes a driving manner of the reference TFT 101 is approximately the same to that of a corresponding TFT(s) in the active area. That is, voltages applied on the source S, the drain D and the gate G of the reference TFT 101 are approximately the same as the respective voltages on the source, the drain and the gate of each to-be-simulated TFT in the active area. As such, drift behaviors of I-V characteristic curves of the reference TFT 101 and the to-be-simulated TFT(s) in the active area have a certain regular similarity.

In an exemplary embodiment, the voltages on the source S, the drain D and the gate G of the reference TFT 101 may be respectively set to be an average value of source voltages, an average value of drain voltages and an average value of gate voltages of all TFTs in the active area; or, the voltages on the source S, the drain D and the gate G of the reference TFT 101 may be respectively set to be a source voltage, a drain voltage and a gate voltage of a TFT on a certain scan line in the active area.

In the display mode, the control module 102 controls a driving current sensing unit (also referred to as driving current sensor) 104 to be at a non-working state (e.g., an inactive state). At this time, the driving current sensing unit 104 is without output, so that an analog-to-digital converter (ADC) 105, a comparison unit (also referred to as comparator) 201, a storage unit 202, a table lookup unit 203, a driving voltage calculation unit (also referred to as driving voltage calculator) 301, a first digital-to-analog (DAC) 302 and a second DAC 303 all are at inactive states. In an exemplary embodiment, the comparison unit 201, the table lookup unit 203 and the driving voltage calculation unit 301 may be embodied/implemented by a same processing circuit such as one or more processors.

In the detection compensation mode, the control module 102 controls the driving circuit sensing unit 104 to give voltages on the source S, the drain D and the gate G of the reference TFT 101 respectively being equal to a source voltage, a drain voltage and a gate voltage used during establishing the look-up table. Meanwhile, the driving current sensing unit 104 detects/senses a driving current $I_{dref}$ of the reference TFT 101. The ADC 105, the comparison unit 201, the storage unit 202, the table lookup unit 203, the driving voltage calculation unit 301, the first DAC 302 and the second DAC 303 all are at active states. The ADC 105 converts the analog driving current $I_{dref}$ into a digital signal. The comparison unit 201 obtains the digital signal and compares it with a target driving current $I_{dA}$ stored in the storage unit 202 to obtain a driving current drift value ΔI. The table lookup unit 203 searches the compensation look-up table stored in the storage unit 202 according to the driving current drift value ΔI to obtain the scan signal compensation voltage value ΔV.

For a more detailed description of the second way, please refer to the Chinese patent document CN 201710948642.8 (which is a Chinese patent application serial number and has a same assignee as that of the instant application), the disclosure of which is incorporated herein by reference.

For the Step 2, after the scan signal compensation voltage value is determined, it is needed to adjust the gate driving circuit for outputting scan signals. In particular, the gate driving circuit may include COF driving circuits, COG driving circuits, or GOA driving circuits, etc., and each circuit will receive at least one of the inputs consisting of clock signals CK&XCK, DC voltage sources LCC_vss, Q_vss, G_vss, etc., so as to ensure the output of the scan signals. In order to adjust voltage amplitudes of the scan signals, it is preferred to adjust a turn-on voltage VGH and a turn-off voltage VGL on a scan line. The turn-on voltage VGH is usually realized by high voltage level of the clock signals CK&XCK, and the turn-off voltage VGL is usually realized by a voltage value of the DC voltage source G_vss. Therefore, the adjustments of the turn-on voltage VGH and the turn-off voltage VGL are achieved by adjusting the clock signals CK&XCK and the DC voltage source G_vss inputted to the gate driving circuit.

Specifically, the adjustment of the turn-on voltage of the scan signal is achieved by the high voltage level of the clock signals (CK&XCK), and the adjustment of the turn-off voltage of the scan signal is achieved by the magnitudes of first DC voltage value G_vss1 and the second DC voltage value G_vss2.

In addition, the detecting period and the adjusting period can be set in a period of the display device being powered on, or a display image being switched, or a signal source being switched. Moreover, the detecting is performed firstly, and then the gate driving circuit is adjusted in the adjusting period according to a result of the detecting.

In the embodiment of the disclosure, after the scan signal compensation voltage value is obtained, the amplitude of the clock signals and the DC voltage source inputted to the gate driving circuit are adjusted, thereby solving the problems of ghost and flicker caused by the drift(s) of I-V characteristic curve of the TFT(s) resulting from a long-term voltage difference.

Embodiment 2

Figure 6:
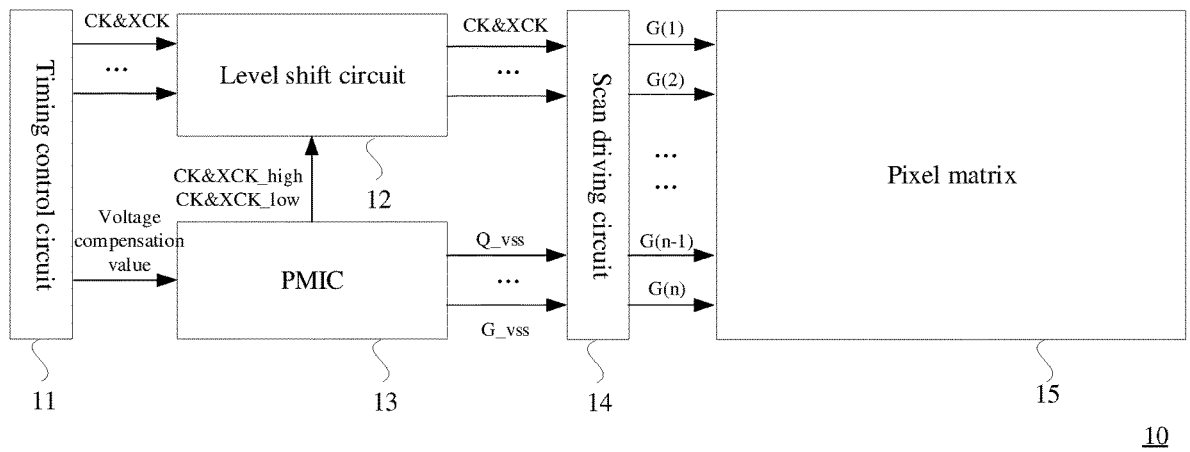
FIG. 6 is a schematic view showing a circuit structure of a display device according to an embodiment of the disclosure.
Figure 7:
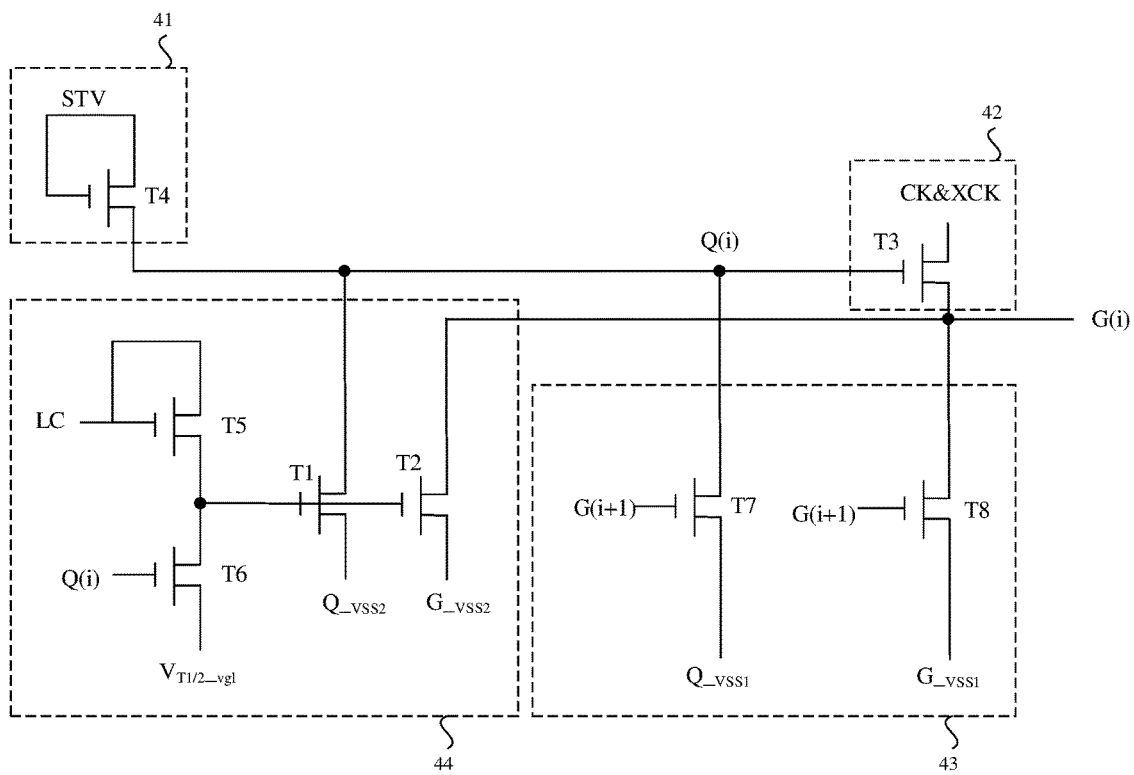
FIG. 7 is a schematic structural view of a stage of GOA driving circuit according to an embodiment of the disclosure.
Figure 8:
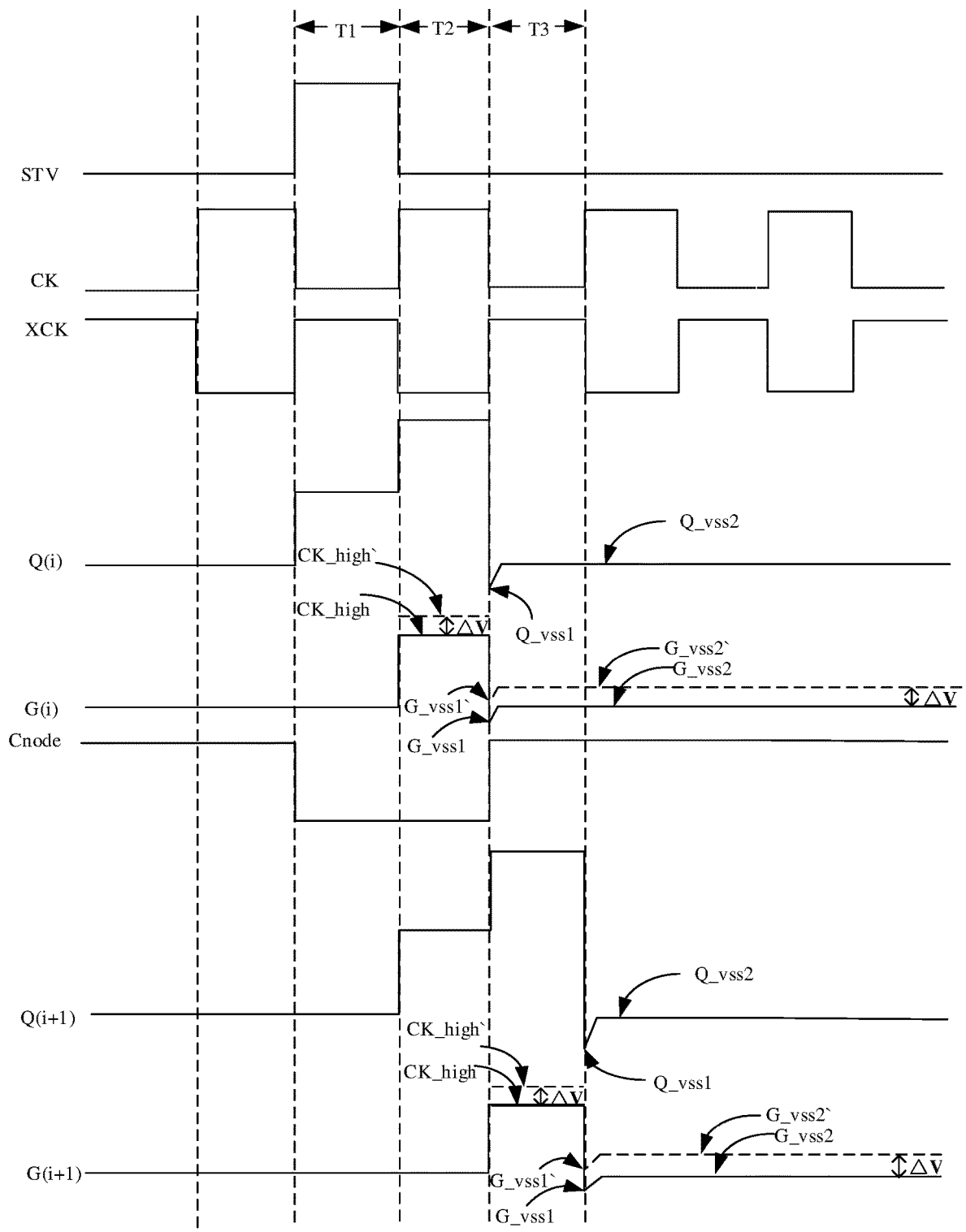
FIG. 8 is a schematic diagram of a timing control of the GOA driving circuit according to an embodiment of the disclosure.

Referring to FIG. 6, FIG. 7 and FIG. 8, FIG. 6 is a schematic view showing a circuit structure of a display device 10 according to an embodiment of the disclosure, FIG. 7 is a schematic structural view of a stage of GOA driving circuit according to an embodiment of the disclosure, and FIG. 8 is a schematic diagram showing a timing control of the GOA driving circuit according to an embodiment of the disclosure. Based on the above embodiments, this embodiment takes the gate driving circuit including the GOA driving circuits as an example, and a working principle of the scan signal compensation method is described in detail below.

Specifically, the display device 10 may include a timing control circuit (Tcon) 11, a level shift circuit 12, a power management integrated circuit (PMIC) 13, a scan driver circuit 14 and a pixel matrix 15.

For the first way of time detecting used to compensate the scan signal, the timing control circuit 11 obtains the accumulated working time from a timer, and searches for the corresponding scan signal compensation voltage value from the first look-up table. The scan signal compensation voltage value then is transmitted to the PMIC 13, and the PMIC 13 adjusts the high voltage levels CK_high, XCK_high of the outputted clock signals, and meanwhile the PMIC 13 controls the first DC voltage value G_vss1 and the second DC voltage value G_vss2 outputted therefrom. A preferred adjustment manner is that adjustment magnitude and direction of the high voltage levels CK_high and XCK_high are the same as that of the second DC voltage value G_vss2, which has the advantage of avoiding changing the symmetry of positive and negative polarities of the TFT(s) in the active area.

Optionally, regarding the second way of current detecting used to compensate the scan signal, the timing control circuit 11 (for performing the functions of the comparison unit 201, the storage unit 202 and the table lookup unit 203 shown in FIG. 5) obtains a driving current $I_d$ of the reference TFT which is positioned in a dummy area outside the active area, compares the driving current $I_d$ and a target driving current to obtain a driving current difference $\Delta I$, and then determines the scan signal compensation voltage value $\Delta V$ from a pre-stored second look-up table according to the driving current difference $\Delta I$. After that, the scan signal compensation voltage value $\Delta V$ is sent to the PMIC 13 (for performing the function of the driving voltage calculation unit 301, the first DAC 302 and the second DAC 303 shown in FIG. 5). The PMIC 13 adjusts the high voltage levels CK_high, XCK_high (e.g., $VGH_{new}$ shown in FIG. 5) of the outputted clock signals, and meanwhile the PMIC 13 controls the first DC voltage value G_vss1 and the second DC voltage value G_vss2 (e.g., $VGL_{new}$ shown in FIG. 5). A preferred adjustment manner is that adjustment magnitude and direction of the high voltage levels CK_high and XCK_high are the same as that of the second DC voltage value G_vss2, which has the advantage of avoiding changing the symmetry of positive and negative polarities of the TFT(s) in the active area.

Referring again to FIG. 7 and FIG. 8, the following focuses on how the GOA driving circuit realizes the output of the adjusted scan signal.

The exemplary GOA driving circuit 14 for example includes a pull-up control unit 141, a pull-up unit 142, a pull-down unit 143 and a pull-down maintaining unit 144. The pull-up control unit 141 mainly includes a fourth TFT T4 and is configured (i.e., structured and arranged) for receiving a scan signal G(i−1) of a preceding stage of GOA driving circuit and generating a scan control signal Q(i) for controlling the operation of the pull-up unit 122. The pull-up unit 122 mainly includes a third TFT T3 and is configured for transmitting a turn-on voltage VGH formed by a high voltage level of the clock signals CK&XCK to scan line G(i) under the control of the scan control signal Q(i). The pull-down unit 123 mainly includes a seventh TFT T7 and an eighth TFT T8 and is configured for transmitting a turn-off voltage VGL formed by a first DC source voltage value G_vss1 to the scan line G(i) under the control of a succeeding stage of scan signal G(i+1). The pull-down maintaining unit 124 mainly includes a first TFT T1, a second TFT T2, a fifth TFT T5 and a sixth TFT T6 and is configured for turning off the first TFT T1 and the second TFT T2 or maintaining turned-on states of the first TFT T1 and the second TFT T2, under the control of the scan control signal Q(i). That is, when the scan control signal Q(i) is at a high voltage level, the sixth TFT T6 is turned on, a low voltage level $V_{T1/2}$_vgl is inputted to the control terminals of the first TFT T1 and the second TFT T2 to turn off the first TFT T1 and the second TFT T2. Under the control of the succeeding stage of scan signal G(i+1), a low voltage formed by a third DC voltage value Q_vss1 is used as the scan control signal Q(i) to turn off the sixth TFT T6, and at this time the fifth TFT T5 controlled by the low frequency signal LC is turned on to introduce a high voltage level onto the control terminals of the first TFT T1 and the second TFT T2 so as to turn on the first TFT T1 and the second TFT T2. The second DC voltage value G_vss2 is used as the turn-off voltage VGL and transmitted to the i-th row scan line G(i).

More specifically, the detecting period is entered immediately after the display device is powered on, a drift situation of the TFT(s) in the active area is detected, and the scan signal compensation voltage value $\Delta V$ is determined (specific determining way refers to the Chinese patent documents CN201710949232.5 and CN201710948642.8 as mentioned above). For example, if the turn-on voltage VGH and the turn-off voltage VGL of the scan signal are simultaneously increased with $\Delta V$, that is, the adjusted turn-on voltage VGH'=VGH+$\Delta V$, and the adjusted turn-off voltage VGL'=VGL+$\Delta V$.

Since the clock signal CK_high inputted to the GOA driving circuit acts as the turn-on voltage of the scan signal on the scan line G(i), the clock signal is adjusted by the PMIC, and the adjusted clock signal CK_high'=CK_high+$\Delta V$. Since the second DC voltage value G_vss2 inputted to the GOA driving circuit acts as the turn-off voltage of the scan signal on the scan line G(i), the DC voltage value is adjusted by the PMIC, and the adjusted second DC voltage value G_vss2'=G_vss2+$\Delta V$. In addition, the first DC voltage value G_vss1 inputted to the GOA driving circuit will serve as the turn-off voltage of the scan signal on the scan line G(i) prior to the second DC voltage value G_vss2, due to that the charging time of the first DC voltage value G_vss1 is relatively short, and thus it may be not adjusted. Preferably, the first DC voltage value G_vss1 is adjusted similarly to the second DC voltage value G_vss2.

Subsequently, the display device enters the adjusting period. At the time T1, the STV signal for the i-th row scan line forms a high voltage level, and at this time the clock signal CK is at a low voltage level, XCK is at a high voltage level. Since the STV signal is at the high voltage level, the scan control signal Q(i) for the i-th row scan line is pulled to a high level, and at this time the sixth TFT T6 is turned on, and the low voltage signal $V_{T1/2}$_vgl is transmitted to a node C of the i-th stage of GOA driving circuit, so that the node C exhibits a low voltage level at the time T1.

At the time T2, the STV signal for the i-th row scan line forms a low voltage level, and at this time the clock signal CK is at a high voltage level and XCK is at a low voltage level. Since the node C exhibits a low voltage level, the first TFT T1 and the second TFT T2 are turned off, and the fourth DC voltage value Q_vss2 (low voltage level) is interrupted, so that the scan control signal Q(i) for the i-th row scan line is pulled up again, and the third TFT T3 is turned on. At this moment the adjusted clock signal CK_high' is loaded onto the i-th row scan line to form the adjusted turn-on voltage VGH' of the scan signal on the i-th scan line G(i), and meanwhile the STV signal for the i-th row scan line is at a high voltage level, it starts to repeat the signal action on the i-th row scan line.

At the time T3, the scan signal G(i+1) on the (i+1)th row scan line is at a high voltage level, and at this time the seventh TFT T7 and the eighth TFT T8 both are turned on, and the first DC voltage value G_vss1 (if being adjusted, it becomes G_vss1') is inputted to the i-th row scan line as the scan signal of the i-th row scan line G(i). At the same time, the third DC voltage value Q_vss1 becomes the i-th row scan control signal Q(i). Due to the scan control signal Q(i) jumps to a low voltage level, the sixth TFT T6 is turned off, and the fifth TFT T5 controlled by the low frequency signal LC is turned on to introduce a high voltage level to the control terminals of the first TFT T1 and the second TFT T2, So that the first TFT T1 and the second TFT T2 are turned on. The amplitude of the scan control signal Q(i) of the i-th row and the amplitude of the scan signal on the i-th row scan line G(i) respectively become the fourth DC voltage value Q_vss2 and the adjusted second DC voltage value G_vss2', that is, the adjusted second DC voltage value G_vss2' is loaded onto the i-th row scan line to form a turn-off voltage VGL' of the adjusted scan signal on the i-th scan line G(i).

The (i+1)th row scan line repeats the action of the i-th scan line, and thus will not be repeated herein.

In this embodiment, after the scan signal compensation voltage value is determined, by adjusting the voltage amplitude(s) of the clock signal(s) and the voltage value(s) of the DC voltage source(s) outputted from the PMIC, the problems of image ghost and flicker caused by I-V characteristic drift of the TFTs in the active area can be solved, and the stability of the display device is improved consequently.

Embodiment 3

Figure 9:
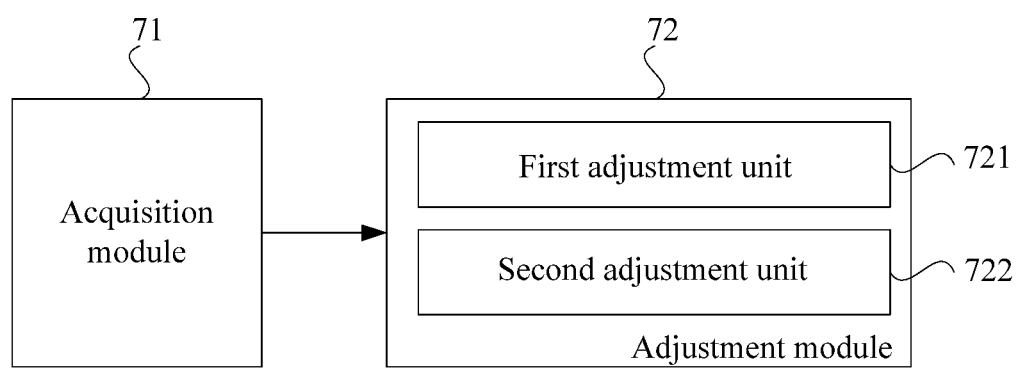
FIG. 9 is a schematic view showing logic modules a scan signal compensating device according to an embodiment of the disclosure.

This embodiment provides a scan signal compensation device based on a gate driving circuit. Referring to FIG. 9, and FIG. 9 is a schematic view showing logic modules of the scan signal compensation device 70 based on a gate driving circuit according to the embodiment of the disclosure. In particular, the compensating device 70 may be a section of software codes stored in a memory of the timing control circuit and executable by one or more processor to implement the scan signal compensation method as described in any one of the above embodiments.

More specifically, the device 70 includes an acquisition module 71 and an adjustment module 72. The acquisition module 71 is configured to acquire a scan signal compensation voltage value during a detecting period. The adjustment module 72 is configured to adjust a clock signal(s) and a DC voltage source(s) inputted to the gate driving circuit according to the scan signal compensation voltage value, during an adjusting period.

Furthermore, the adjustment module 72 includes a first adjustment unit 721 and a second adjustment unit 722. The first adjustment unit 721 is configured to adjust a high voltage level of clock signals (CK&XCK) inputted to the gate driving circuit according to the scan signal compensation voltage value. The second adjusting unit 722 is configured to adjust a first DC voltage value (G_vss1) and a second DC voltage value (G_vss2) inputted to the gate driving circuit according to the scan signal compensation voltage value.

An implementation manner of this embodiment is similar to that of the above embodiments and thus will not be repeated herein.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A scan signal compensating method base on a gate driving circuit, wherein the method comprises:
   acquiring a scan signal compensation voltage value in a detecting period; and
   adjusting a clock signal(s) and a direct current (DC) voltage source(s) inputted to the gate driving circuit according to the scan signal compensation voltage value, in an adjusting period;
   wherein acquiring a scan signal compensation voltage value comprises:
   disposing a reference thin film transistor (TFT);
   obtaining a driving current of the reference TFT;
   acquiring a driving current drift value according to the driving current; and
   finding the scan signal compensation voltage value from a second look-up table according to the driving current drift value;
   wherein the reference TFT is positioned in a dummy area, and voltages applied on the source, the drain and the gate of the reference TFT are respectively set to be an average value of source voltages, an average value of drain voltages and an average value of gate voltages of all TFTs in an active area.

2. The method according to claim 1, wherein the gate driving circuit comprises a GOA driving circuit; and correspondingly the GOA driving circuit comprises a pull-up control circuit, a pull-up circuit, a pull-down circuit and a pull-down maintaining circuit; wherein,
   the pull-up control circuit is configured to control startup of the GOA driving circuit;
   the pull-up circuit is configured to control the GOA driving circuit to output a turn-on voltage;
   the pull-down circuit is configured to control the GOA driving circuit to output a turn-off voltage; and
   the pull-down maintaining circuit is configured to maintain the GOA driving circuit to output the turn-off voltage.

3. The method according to claim 1, wherein adjusting a clock signal(s) and a DC voltage source(s) inputted to the gate driving circuit according to the scan signal compensation voltage value comprises:
   adjusting a high voltage level of the clock signal(s) inputted to the gate driving circuit according to the scan signal compensation voltage value; and
   adjusting a first DC voltage value and a second DC voltage value inputted to the gate driving circuit according to the scan signal compensation voltage value.

4. The method according to claim 3, wherein a first adjustment value corresponding to the high voltage level of the clock signal(s) is equal to a second adjustment value corresponding to the second DC voltage value.

5. The method according to claim 3, wherein adjusting a high voltage level of the clock signal(s) inputted to the gate driving circuit according to the scan signal compensation voltage value comprises:
controlling a power management integrated circuit to adjust amplitude of the high voltage level of the clock signal(s) outputted to a level shift circuit, in a period of next power on or an image being switched.

6. The method according to claim 3, wherein adjusting a first DC voltage value and a second DC voltage value according to the scan signal compensation voltage value comprises:
controlling a power management integrated circuit to adjust magnitudes of the first direct current voltage value and the second direct current voltage value outputted to the gate driving circuit, in a period of next power on or an image being switched;
wherein amplitude of the first DC voltage value is greater than that of the second DC voltage value.

7. A scan signal compensating method base on a gate driving circuit,
wherein the method comprises:
acquiring a scan signal compensation voltage value in a detecting period; and
adjusting a clock signal(s) and a direct current (DC) voltage source(s) inputted to the gate driving circuit according to the scan signal compensation voltage value, in an adjusting period;
wherein acquiring a scan signal compensation voltage value comprises:
disposing a reference thin film transistor (TFT);
obtaining a driving current of the reference TFT;
acquiring a driving current drift value according to the driving current; and
finding the scan signal compensation voltage value from a second look-up table according to the driving current drift value;
wherein the reference TFT is positioned in a dummy area, and voltages applied on the source, the drain and the gate of the reference TFT are respectively set to be a source voltage, a drain voltage and a gate voltage of a TFT on a scan line of an active area.

8. The method according to claim 7, wherein the gate driving circuit comprises a GOA driving circuit; and correspondingly the GOA driving circuit comprises a pull-up control circuit, a pull-up circuit, a pull-down circuit and a pull-down maintaining circuit; wherein,
the pull-up control circuit is configured to control startup of the GOA driving circuit;
the pull-up circuit is configured to control the GOA driving circuit to output a turn-on voltage;
the pull-down circuit is configured to control the GOA driving circuit to output a turn-off voltage; and
the pull-down maintaining circuit is configured to maintain the GOA driving circuit to output the turn-off voltage.

9. The method according to claim 7, wherein adjusting a clock signal(s) and a DC voltage source(s) inputted to the gate driving circuit according to the scan signal compensation voltage value comprises:
adjusting a high voltage level of the clock signal(s) inputted to the gate driving circuit according to the scan signal compensation voltage value; and
adjusting a first DC voltage value and a second DC voltage value inputted to the gate driving circuit according to the scan signal compensation voltage value.

10. The method according to claim 9, wherein a first adjustment value corresponding to the high voltage level of the clock signal(s) is equal to a second adjustment value corresponding to the second DC voltage value.

11. The method according to claim 9, wherein adjusting a high voltage level of the clock signal(s) inputted to the gate driving circuit according to the scan signal compensation voltage value comprises:
controlling a power management integrated circuit to adjust amplitude of the high voltage level of the clock signal(s) outputted to a level shift circuit, in a period of next power on or an image being switched.

12. The method according to claim 9, wherein adjusting a first DC voltage value and a second DC voltage value according to the scan signal compensation voltage value comprises:
controlling a power management integrated circuit to adjust magnitudes of the first direct current voltage value and the second direct current voltage value outputted to the gate driving circuit, in a period of next power on or an image being switched;
wherein amplitude of the first DC voltage value is greater than that of the second DC voltage value.

* * * * *